US006436763B1

(12) United States Patent
Huang et al.

(10) Patent No.: US 6,436,763 B1
(45) Date of Patent: Aug. 20, 2002

(54) PROCESS FOR MAKING EMBEDDED DRAM CIRCUITS HAVING CAPACITOR UNDER BIT-LINE (CUB)

(75) Inventors: Jenn Ming Huang, Hsin-Chu; Yu-Hua Lee, Hsinchu; Cheng Ming Wu, Kao-Hsiung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/498,738

(22) Filed: Feb. 7, 2000

(51) Int. Cl.$^7$ ................................. H01L 21/8242
(52) U.S. Cl. ........................... 438/255; 438/239
(58) Field of Search .............................. 438/238, 239, 438/253, 255, 396, 398, 597, 618, 636, 637

(56) References Cited

U.S. PATENT DOCUMENTS

| | | | |
|---|---|---|---|
| 5,338,700 A | 8/1994 | Dennison et al. | 437/60 |
| 5,858,835 A | * 1/1999 | Lin | 438/253 |
| 5,888,863 A | 3/1999 | Tseng | 438/253 |
| 5,893,734 A | 4/1999 | Jeng et al. | 438/239 |
| 5,895,250 A | 4/1999 | Wu | 438/396 |
| 5,897,350 A | 4/1999 | Lee et al. | 438/238 |
| 5,902,126 A | 5/1999 | Hong et al. | 438/396 |

* cited by examiner

Primary Examiner—Richard Elms
Assistant Examiner—Beth E. Owens
(74) Attorney, Agent, or Firm—George O. Saile; Stephen B Ackerman

(57) ABSTRACT

A method for fabricating capacitor-under-bit line (CUB) DRAMs with logic circuits is achieved. CUB are better than capacitor-over-bit line (COB) DRAM circuits because of reduced contact aspect ratios, but CUB require patterning the capacitor top plate over the capacitor rough topography while providing openings to bit line contacts between closely spaced capacitors. A bottom antireflecting coating (BARC) is used in a first method; a non-conform PECVD oxide is used in a second method to make reliable high aspect ratio openings between the capacitors. The BARC is deposited to fill the space between capacitors. A photo-resist layer with improved uniformity is then deposited over the BARC and exposed and developed to form an etch mask with improved resolution for the capacitor top plate. The BARC is plasma etched, and the polysilicon plate is patterned. In the second method a non-conformal PECVD oxide is deposited that is thicker on the top of the capacitors than in the narrow space between capacitors. The PECVD oxide is anisotropically etched back to form self-aligned openings over the bit line contacts, and openings are etched in the polysilicon capacitor top plate aligned over the bit line contact openings. A photoresist etch mask is then used to complete the patterning of the top plate.

20 Claims, 9 Drawing Sheets

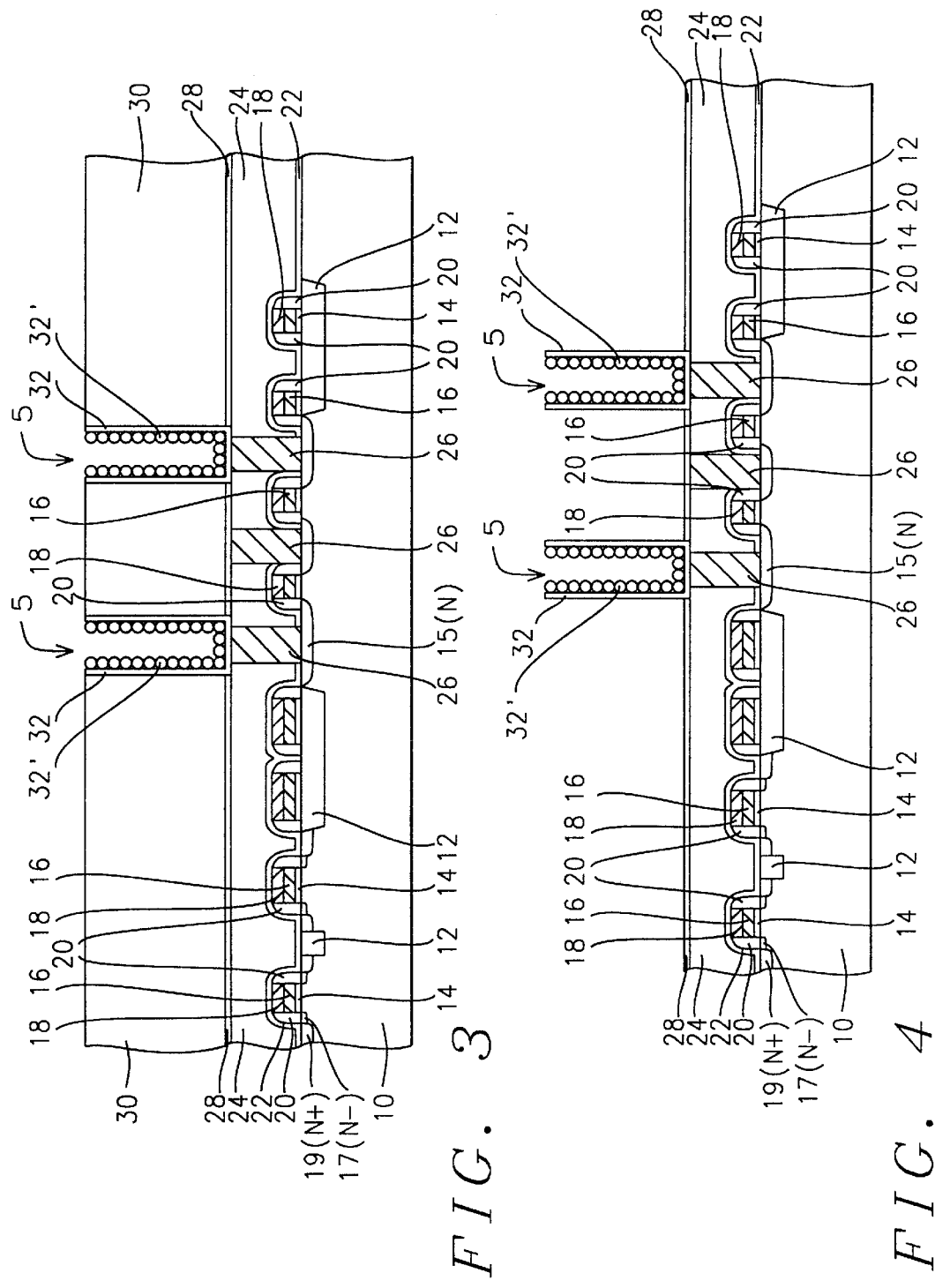

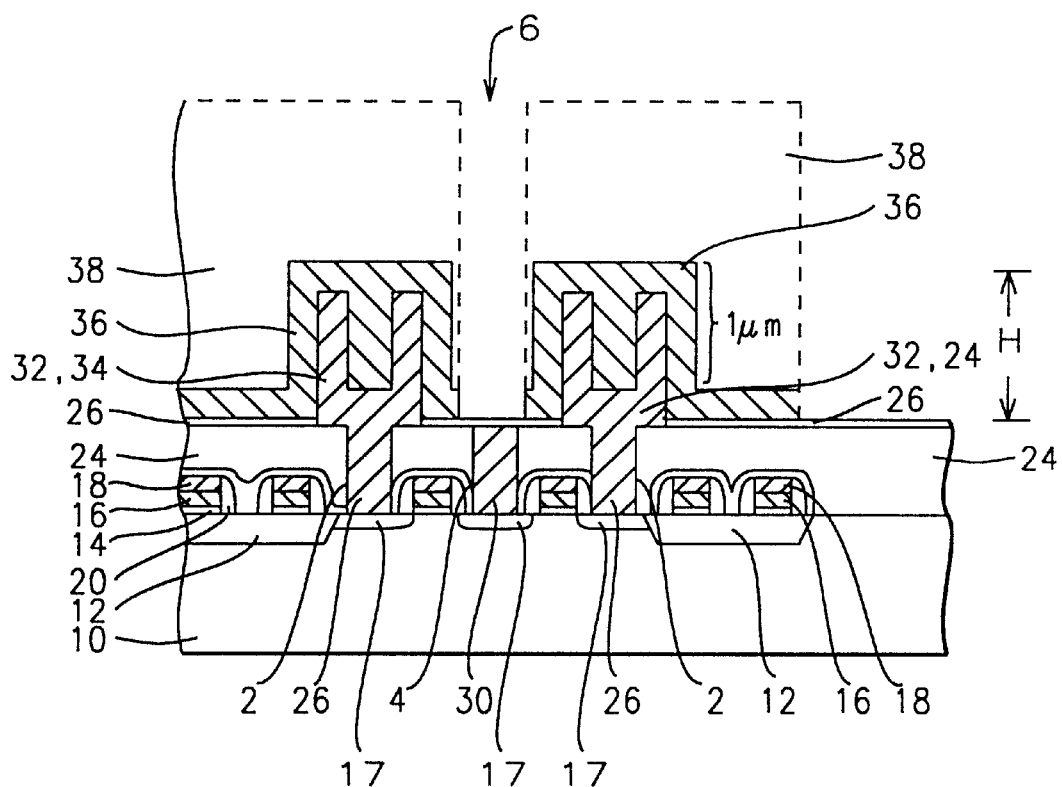
FIG. 13 – Prior Art

PROCESS FOR MAKING EMBEDDED DRAM CIRCUITS HAVING CAPACITOR UNDER BIT-LINE (CUB)

BACKGROUND OF THE INVENTION (1) Field of the Invention

This invention relates to semiconductor integrated circuit devices, and more particularly to a method for making capacitors under bit lines (CUBS) embedded dynamic random access memory (DRAM). The process is particularly useful for integrating (embedding) high-density memory with logic circuits on the same chip. Polysilicon landing plugs are used in the DRAM for the capacitor node contacts and for the bit line contacts to minimize the capacitor node leakage current. The capacitor-under-bit line (CUB) DRAM allows metal contacts with lower aspect ratio to be made to the logic circuits for lower resistance ($R_C$) contacts and increased circuit performance.

(2) Description of the Prior Art

Capacitor-under-bit line (CUB) are more desirable than capacitor-over-bit line (COB) for embedding DRAM circuits with logic circuits because the contact to the logic circuits can be made with lower aspect ratios. However, one problem in making capacitor-under-bit line (CUB) DRAM is the need to pattern the top polysilicon electrode (plate) for the DRAM capacitor while providing reliable contact openings for bit line contacts between the closely spaced capacitors. This problem is best understood with reference to the schematic cross-sectional view a conventional CUB DRAM shown in FIG. 13 making electrical contact to the N doped region 17 in the substrate 10. Typically the DRAM cell areas are defined on the surface of a silicon substrate 10 by forming a field isolation 12, such as shallow trench isolation (STI), that surrounds and electrically isolates the individual memory cell device areas. A gate oxide 14 is grown on the device areas and a first polysilicon layer 16 with an upper silicide layer 18 is deposited and patterned to form the FET polycide gate electrodes over the device areas and DRAM word lines over the STI 12. A first etch-stop layer 22 (e.g., silicon nitride), a planar insulating layer 24 (comonly referred to as an interlevel dielectric or ILD layer), and a second etch-stop layer 26 are formed sequentially over the polycide gate electrodes. Contact openings 2 and 4 are etched in layers 26, 24 and 22 for the capacitor node contacts and bit line contacts, respectively. A conductively doped second polysilicon layer is deposited and etched or polished back to form polysilicon plugs 30 in the contact apenings 2 and 4. Next, a third polysilicon layer is used to form bottom electrodes 32 by various means, such as the crown shaped capacitors shown in FIG. 13. A thin interelectrode dielectric 34 (not explicitly shown in FIG. 13) is formed on the surface of electrode 32, and a doped conformal fourth polysilicon layer 36 is deposited to form the capacitor top electrodes. The top electrodes 36 then patterned using a photoresist mask 38. Unfortunately, as feature sizes are reduced for increased circuit density, it is also necessary to increase the capacitor height H (greater than 1.0 micrometers) to maintain a reasonable capacitance for storing charge. Therefore, the conventional photoresist mask 38 must be made sufficiently thick to protect the top portion of the capacitor electrodes when plasma etching is used to pattern the fourth polysilicon layer 36. Because of the rough surface topography, the conventional photoresist layer is quite thick. This thick photoresist and the shallow depth of focus required for exposing high resolution images in the photoresist make it difficult to achieve the necessary resolution. This high resolution photoresist patterning and etching is a particular problem for the high aspect ratio openings 6 between the closely spaced capacitors in which polysilicon layer 36 must be etched over the bit line contact opening 4 for the common bit line contact between the adjacent memory cells. Also, the conventional method requires very accurate lithography alignment.

Several methods for making improved DRAM circuits have been reported in the literature. One method for making capacitor-under-bit line (CUB) DRAMs is described in U.S. Pat. No. 5,893,734 to Jeng et al. in which tungsten landing plugs are used to improve the electrical conductivity. In U.S. Pat. No. 5,897,350, Lee et al. teach a method for making a capacitor-over-bit line (COB) DRAM which circumvents the rough topography problem associated with making CUB DRAM structures. In U.S. Pat. No. 5,238,700 to Dennison et al. a method is described for making a CUB structure in which contact openings are etched through an insulating layer and through the capacitor polysilicon top electrode to the bit line landing plug. The polysilicon top electrode exposed in the bit line contact opening is then recessed and oxidized before the bit line contact is formed in the contact opening. Other methods for making DRAM capacitors are described in U.S. Pat. No. 5,902,126 to Hong et al. in which the capacitor is made over the bit line (COB), and in U.S. Pat. No. 5,888,863 to Tseng a method for fabricating capacitors in memory circuits in described, but do not address the bit line contacts. In U.S. Pat. No. 5,895,250 to Wu a method is described for making semicrown shaped capacitors, but the method for making bit line contacts is also not addressed.

However, there is still a need in the semiconductor industry to provide a very cost-effective process for making capacitor-under-bit lines embedded DRAM circuits that minimize the contact aspect ratio for logic circuits while increasing memory cell density and minimizing capacitance node leakage current.

SUMMARY OF THE INVENTION

It is a principal object of the present invention to make capacitors under bit lines (CUB) embedded DRAM circuits with high performance logic circuits on the same chip that result in reduced aspect ratio contacts.

It is another object of the present invention to achieve the above objective using polysilicon plug contacts in the DRAM cells to minimize the capacitor node leakage currents while reducing the aspect ratio for the contacts to the logic circuits.

It is still another object of this invention, by a first embodiment, to use a bottom antireflecting coating (BARC) to fill the narrow spaces between adjacent stacked capacitors. This reduces the rough topography over the capacitors and allows an overlying photoresist layer to be exposed and developed with better definition (fidelity) for patterning the capacitor top electrodes. This provides more reliable contact openings to the bit line polysilicon land plug contacts.

Still another object of this invention, by a second embodiment, is to use a plasma enhanced chemical vapor deposition (PECVD) to deposit a non-conformal silicon oxide ($SiO_x$) layer having a thicker portion on the top of the capacitors and a thinner portion at the base between the closely spaced capacitors. The PECVD oxide layer is anisotropically plasma etched back to form self-aligned openings between the capacitors. The PECVD oxide mask with these self-aligned openings is then used to etch open areas in the capacitor polysilicon top electrodes aligned over the polysilicon landing plugs for the bit line contacts.

Another object of the invention is to provide a process which is compatible with forming a hemispherical silicon grain (HSG) surface on the polysilicon bottom electrode of the capacitor to increase the capacitance.

The method for making these improved embedded DRAM logic circuits starts by providing a semiconductor substrate. Typically the substrate is a P$^-$ doped single-crystal silicon having a <100> crystallographic orientation. A field oxide is formed using shallow trench isolation (STI) to surround and electrically isolate device areas in logic regions and DRAM regions on the substrate. A thin gate oxide is formed on the device areas. A conductively doped first polysilicon layer is deposited on the substrate and a silicide layer is deposited and patterned to form field effect transistor (FET) polycide gate electrodes on the device areas, and word lines over the STI regions. Source/drain areas are formed by ion implanting an N-type conductive dopant adjacent to the gate electrodes for N-channel FETs. By including a photoresist implant block-out mask, the FET electrical characteristics can be separately modified for both the DRAM and logic circuits, and can include P-channel FETs for fabricating CMOS circuits on the same chip. A conformal insulating layer is deposited and anisotropically etched back to form sidewall spacers on the gate electrodes. Continuing, a first etch-stop layer, for example composed of silicon nitride ($Si_3N_4$), is deposited, and a planar first insulating layer, commonly referred to as an interpolysilicon oxide (IPO-1), is formed. Typically the IPO-1 is a chemical vapor deposited (CVD) silicon oxide ($SiO_2$) and is planarized using an etch-back or chemical-mechanical polishing (CMP) technique. Contact openings are etched in the first insulating layer and the first etch-stop layer to the source/drain areas in the memory regions for capacitor node contacts and bit line contacts. A polysilicon layer is deposited with an N-type dopant and polished back to form polysilicon plugs in the contact openings. A second etch-stop layer, such as $Si_3N_4$, is deposited on the planar first insulating layer and a second insulating layer, such as a CVD $SiO_2$, is deposited. Next, capacitor openings are etched in the second insulating layer and the second etch-stop layer aligned over and etched to the polysilicon plugs in the capacitor node contact openings, in which the array of storage capacitors are formed for the embedded DRAM circuits. An N-type doped conformal third polysilicon layer is deposited and polished back to the second insulating layer to form the capacitor bottom electrodes in the capacitor openings. The third polysilicon layer can also be formed as a hemispherical silicon grain layer to increase the surface area and therefore the capacitance. The second insulating layer is then removed selectively to the etch-stop layer using a hydrofluoric acid solution, leaving freestanding crown-shaped capacitor bottom electrodes. A thin interelectrode dielectric layer, such as a silicon oxide/silicon nitride/silicon oxide (ONO), is formed on the bottom electrodes.

Relating now more specifically to the invention, an N doped blanket conformal fourth polysilicon is deposited, sufficiently thick to fill the openings in the crown-shaped capacitor bottom electrodes while forming a conformal layer between adjacent capacitor bottom electrodes. Now a key feature of the invention is to avoid the rough topography problem, cited in the prior art of FIG. 13, by depositing a bottom antireflecting coating (BARC) sufficiently thick to essentially fill the spaces between the capacitors. A photoresist layer is then coated on the substrate having an improved profile over the space between capacitors. This improved photoresist profile results in optical exposure of the photoresist with improved resolution (fidelity) needed because of the shallower depth of focus (DOF) required to form submicrometer images. After the photoresist image is developed, the bottom antireflective coating (BARC) is then anisotopically plasma etched to form well defined openings between the capacitors and over the bit line contacts. The patterned photoresist/BARC etch mask and anisotropic plasma etching are used to pattern the fourth polysilicon layer to form capacitor top electrodes, and concurrently to expose the second etch-stop layer over the polysilicon plugs in the bit line contact openings. The embedded DRAM and logic are now completed to the first level of metal interconnections by depositing a fourth insulating layer over the capacitors. This layer, commonly referred to as an interlevel dielectric (ILD) layer, is typically a CVD $SiO_2$, and is chemical-mechanical polished back to provide a planar surface for the next level of interconnections. Via holes are etched in the fourth insulating layer to the polysilicon plugs in the bit line contact openings, to the capacitor top electrodes, and concurrently etched to the source/drain contact areas and the FET gate electrodes in the logic regions. Since the CUB embedded DRAMs do not include the additional polysilicon and insulating layers necessary for making COB DRAMs, the via holes are substantially reduced in aspect ratio. Metal plugs are now formed in the via holes by depositing a tungsten metal and etching or polishing back to the surface of the fourth insulator. A metal layer, such as an aluminum-copper (Al/Cu) alloy is deposited and patterned to form bit lines for the embedded DRAM circuits and for the first level of metal interconnections for the logic.

In a second embodiment, the process is the same as the first embodiment up to and including the deposition of the fourth polysilicon layer for the capacitor top electrodes (plates). However, in this embodiment the BARC is not used. Instead, a plasma enhanced CVD (PECVD) silicon oxide ($SiO_2$) layer is deposited which is thicker on the top surface of the capacitors than in the spaces between the capacitors. The CVD) oxide is then blanket anisotropically plasma etched back to form openings in the thin CVD) oxide between the capacitors while portions of the thicker oxide remain on the top and sides of the capacitors to protect the capacitor from etching. This results in self-aligned openings over the bit line contacts openings between the capacitors. A photoresist mask and plasma etching are then used to pattern the fourth polysilicon layer to complete the capacitor top electrodes. The remaining process steps for the second embodiment are then completed to the first level of interconnections as described in the first embodiment.

BRIEF DESCRIPTION OF THE DRAWINGS

The above objects and advantages of this invention are best understood with reference to the attached drawings in the figures.

FIGS. 1 through 8 are schematic cross-sectional views, by a first embodiment, showing the sequence of process steps for making embedded CUB DRAM circuits with logic circuits using a BARC to make capacitor top electrodes with improved profiles and bit line contact openings.

FIG. 13 is a schematic cross-sectional view, by the prior art, showing the problem of making capacitor top electrodes with reliable profiles and bit line contact openings.

DESCRIPTION OF THE PREFERRED EMBODIMENTS

The method for making these embedded capacitor-under-bit line (CUB) DRAM circuits with logic circuits for reduced aspect ratio metal contacts is now described in detail. In the first embodiment the invention utilizes a bottom antireflective coating (BARC) to fill the spaces between the closely spaced DRAM capacitors. This results in improved profile of the photoresist mask used to etch the capacitor top electrodes, and allows more reliable bit line contact openings to be made between the closely spaced capacitors. Although for the purpose of this invention the FETs for the DRAM and logic circuits are made at the same time to save process steps, it should be understood by those skilled in the art that by including additional steps the FETs in the DRAM and logic can be individually tailored to optimize electrical performance of the circuit. For example, different FET gate oxides, sidewall spacers and ion implantation can be individually optimized for the logic and memory circuits to maximize the overall circuit performance. The process is described for making only N-channel FETs in the DRAM and logic circuits to simplify the drawings and discussion. It should also be well understood by one skilled in the art that other types of devices can be included on the logic and DRAM circuits. For example, by including N-well and P-well regions on a substrate, P-channel and N-channel FETs can be provided from which Complementary Metal-Oxide-Semiconductor (CMOS) circuits can be formed in the logic and peripheral circuits of the embedded CUB DRAM devices.

Figure 1:
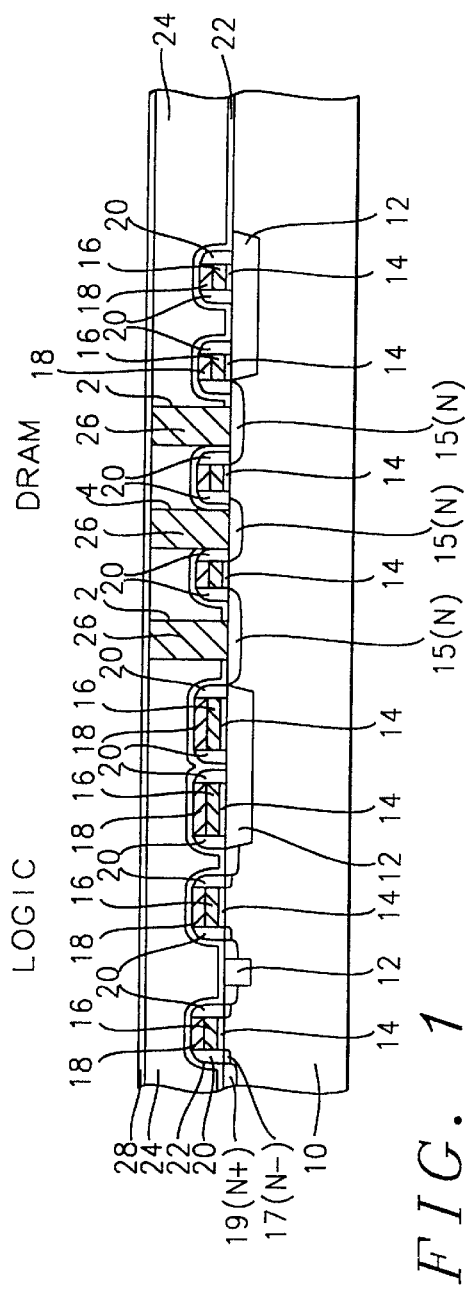

Referring now to FIG. 1, the method begins by providing a semiconductor substrate 10, a portion of which is shown in the Figs. The figures show a schematic cross sectional view of the substrate having on the left a region labeled "LOGIC" for logic circuits and on the right a region labeled "DRAM" for DRAM circuits. For practical reasons only two adjacent DRAM cell capacitors are depicted of the multitude (billions) of memory cells formed in the array of cells. The most commonly used substrate in the industry is a $P^-$ doped single-crystal silicon having a <100> crystallographic orientation. Field oxide regions 12 are formed surrounding and electrically isolating the device areas in both logic and DRAM regions. For advanced high-density circuits the preferred field oxide 12 is a Shallow Trench Isolation (STI), as is commonly practiced in the semiconductor industry. Briefly, the STI is formed by etching trenches in the field oxide areas on the substrate to a depth of between about 2500 and 4000 Angstroms. After forming an optional channel-stop implant and a thin thermal oxide in the trenches to provide a good interface and prevent inversion, the trenches are filled with an insulating material, such as chemical vapor deposited silicon oxide ($CVD-SiO_2$). The STI is made planar with the surface of the substrate 10, for example, by using a planarizing etch-back technique or by chemical-mechanical polishing (CMP).

Still referring to FIG. 1, a thin gate oxide 14 is formed on the device areas. The gate oxide 14 in formed to a thickness of between about 20 and 70 Angstrom, and is most commonly for by thermal oxidation in an oxidation furnace. Next, a first polysilicon layer 16 is deposited by low-pressure chemical vapor deposition (LPCVD) using, for example, silane ($SiH_4$) as the reactant gas. The polysilicon layer 16 is deposited to a thickness of between about 800 and 1500 Angstroms. Layer 16 is doped with an N type conductive dopant, such as arsenic (Ar) or phosphorus (P), either by ion implantation or in situ by adding a dopant gas, such as arsine ($AsH_3$) or phosphine ($PH_3$) during the polysilicon deposition. To reduce electrical resistivity and improve circuit performed, it is typical to include an upper suicide layer 18, such as tungsten silicide ($WSi_2$), to form a polycide layer (layers 16 and 18). The silicide layer 18 is commonly formed by CVD using, for example, tungsten hexafluoride ($WF_6$) and silane ($SiH_4$) as the reactant gases. Silicide layer 18 is deposited to a thickness of between about 800 and 1500 Angstroms. Conventional photolithographic techniques and anisotropic plasma etching are used to pattern the polycide layer (layers 16 and 18) to form the gate electrodes for the FETs. The patterned polycide layer also forms portions of the local interconnections in the logic regions and word lines in the DRAM regions. Lightly Doped source/Drain regions 17 ($N^-$) (comonly referred to as LDD regions) are formed adjacent to the gate electrodes for the logic N-channel FETs by ion implanting an N type conductive dopant. Typically the LDD regions are doped to a concentration of between about 1.0 E 18 and 1.0 E 19 atom/$cm^3$ by implantig $^{75}$As. The DRAM FET source/drain regions 15(N) are formed next by using a photoresist block-out mask (not shown) and implanting $^{31}$p ions. The concentration is determined so as to minimize the capacitor node leakage currents, but is typically doped to a concentration of between about 1.0 E 18 and 1.0 E 19 atoms/$cm^3$. Next, a conformal insulating layer 20 is deposited and anisotropically etched back to form sidewall spacers 20 on the polycide gate electrodes (16, 18). Typically layer 20 is $SiO_2$ or $SiO_2$ and $Si_3N_4$ and is selectively and anisotropically plasma etched back to the silicon substrate 10 using an etchant gas such as $CF_4$ and $H_2$ or $CHF_3$. Another block-out mask (also not shown) is then used and the heavily doped FET source/drain contact regions 19($N^+$) are formed for the logic circuits to minimize contact resistance. Typically the regions 19($N^+$) are doped to a final concentration of between about 1.0 E 19 and 1.0 E 21 atoms/$cm^3$.

Still referring to FIG. 1, a conformal first etch-stop layer 22 is deposited. Layer 22 is preferably composed of silicon nitride ($Si_3N_4$) and is deposited by LPCVD using reactant gases such as silane ($SiH_4$) and ammonia ($NH_3$). Layer 22 is deposited to a preferred thickness of between about 200 and 400 Angstroms. Next a first insulating layer 24 is deposited, commonly referred to as an interpolysilicon oxide one (IPO-1) layer. Layer 24 is preferably composed of $SiO_2$ and is deposited by LPCVD using, for example, tetra-ethosiloxane (TEOS) as the reactant gas. The insulating layer 24 is then planarized by chemical mechanical polishing (CMP) to a preferred thickness of between about 2000 and 4000 Angstroms over the FETs gate electrodes.

Figure 2:
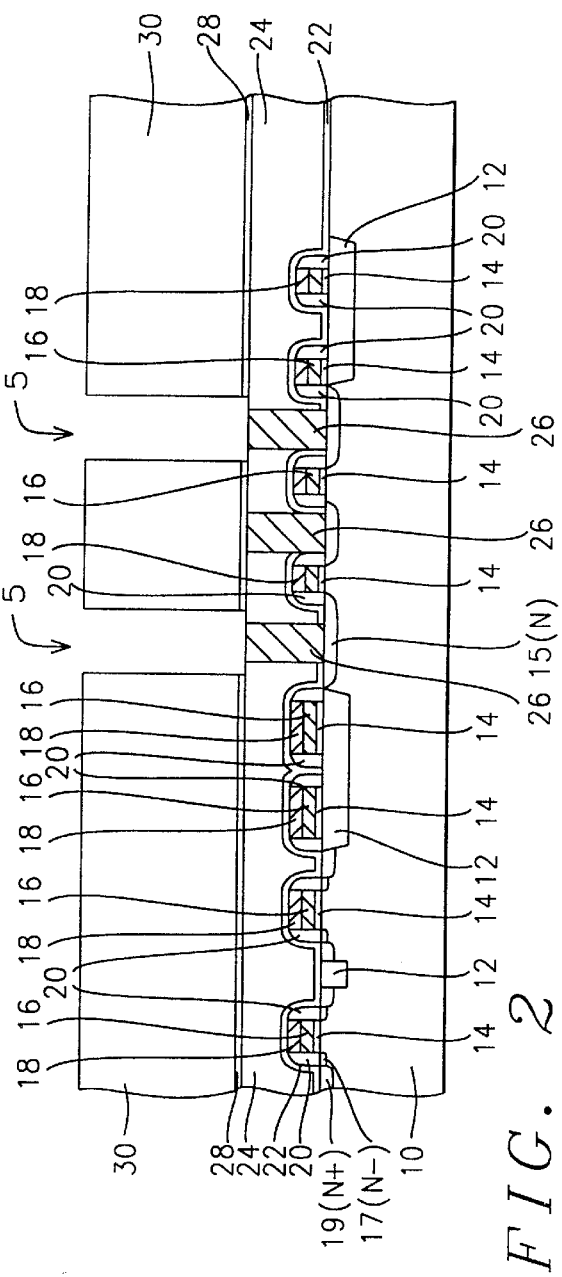

Conventional photolithographic techniques and anisotropic plasma etching are used to etch contact openings in the first insulating layer 24 and first etch-stop layer 22 to the source/drain areas 15(N) in the DRAM region for capacitor node contacts 2 and bit line contact openings 4. An N-doped polysilicon layer 26 is deposited and polished back to layer 24 to form polysilicon landing plugs 26 in the contact openings 2 and 4. The polysilicon is deposited by LPCVD using silane as the reactant gas and is doped in situ with arsenic (As) or phosphorus (P) to a concentration of between about 1.0 E 19 and 1.0 E 21 atoms/$cm^3$. A second etch-stop layer 28, also composed of $Si_3N_4$, is deposited by LPCVD on the first insulating layer 24 and over the polysilicon landing plugs 26. Layer 28 is deposited to a preferred thickness of between about 100 and 500 Angstroms Referring to FIG. 2, a relatively thick disposable second insulating layer 30 is deposited. Layer 30 is preferably a $SiO_2$ and is deposited by LPCVD using TEOS as the reactant gas. The thickness of layer 30 determines the height of the capacitor bottom electrodes, and is typically deposited to a thickness of at least 1.0 micrometers. Next, photolithographic techniques and plasma etching are used to form an array of capacitor openings 5 in the second insulating layer 30 and the second etch-stop layer 28. The openings 5 are aligned over the polysilicon plugs 26 in the capacitor node contact openings 2. The openings 5 define the shape and height H of the capacitors (commonly referred to as crown capacitors) and layer 30 is generally very thick to achieve the greatest possible capacitance. More specifically, the height H of layer 30 is at least greater than 1.0 micrometers (um).

Referring to FIG. 3, a conformal third polysilicon layer 32 is deposited and chemically-mechanically polished back to form the capacitor bottom electrodes in openings 5. Polysilicon layer 32 is preferably deposited by LPCVD and in situ doped with an N-type conductive dopant, such as phosphorus, to a concentration of between about 1.0 E 19 and 1.0 E 21 atoms/cm$^3$. Layer 32 is deposited to a preferred thickness of between about 400 and 1000 Angstroms. Alternatively, layer 32 can be roughened by depositing a hemispherical silicon grain (HSG) layer 32' to further increase surface area, therefore the capacitance.

Referring to FIG. 4, the second insulating layer 30 is then removed selectively to the etch-stop layer 28, and to the polysilicon bottom electrodes 32 using, for example, a hydrofluoric acid solution (HF and $H_2O$). This results in free-standing crown-shaped capacitor bottom electrodes 32. Still referring to FIG. 4, a very thin interelectrode dielectric layer 34 (not shown as a separate layer in FIG. 4) having a high dielectric constant is formed on the surface of polysilicon bottom electrodes 32 or 32'. Layer 34 is typically composed of a film having a high dielectric constant (K), such as silicon nitride-silicon oxide (NO) or a silicon oxide-silicon nitride-silicon oxide layer (ONO). The ONO layer 34 can be formed by oxidizing the polysilicon bottom electrodes 32 to form a $SiO_2$ of about 15 to 20 Angstroms, and depositing a LPCVD silicon nitride of between about 80 and 200 Angstroms. The silicon nitride is then partially reduced by annealing in an oxidation furnace to form a $SiO_2$.

Figure 5:
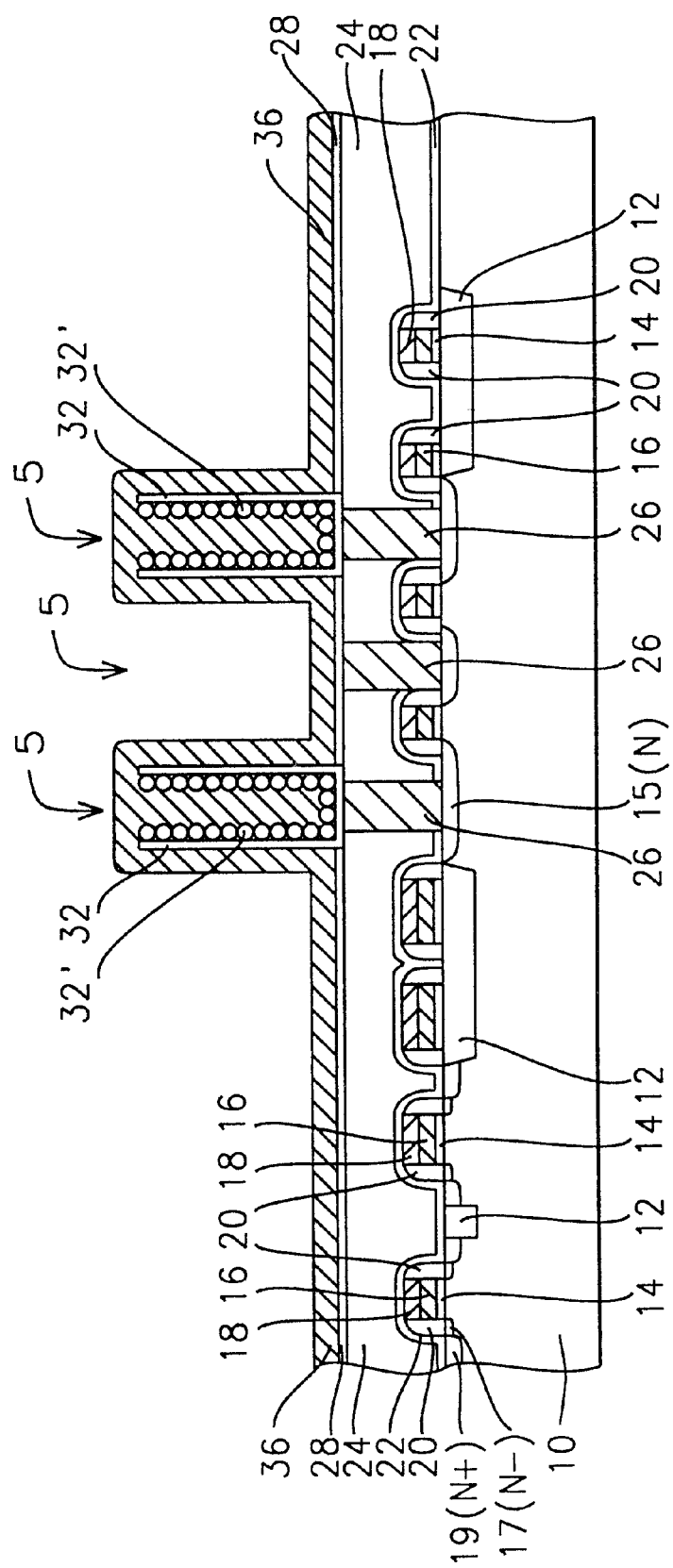

Referring to FIG. 5, the capacitor top electrodes (plate) are formed. Relating more specifically to this invention, a conductively N doped blanket conformal fourth polysilicon layer 36 is deposited, sufficiently thick to fill the remaining openings 5 in the crown-shaped capacitor bottom electrodes 32 while forming a conformal layer in the space S between adjacent bottom electrodes 32. Polysilicon layer 36 is deposited by LPCVD using $SiH_4$ as the reactant gas and is doped in situ with an N type dopant, such as phosphorus, to a concentration of between about 1.0 E 19 and 1.0 E 21 atoms/cm$^3$. The fourth polysilicon layer is deposited to a thickness equal to, or slightly greater than one half the width of the openings 5. For current and future sub-micrometer technologies the polysilicon layer 36 would be deposited to a thickness of between about 500 and 1000 Angstroms.

Figure 6:
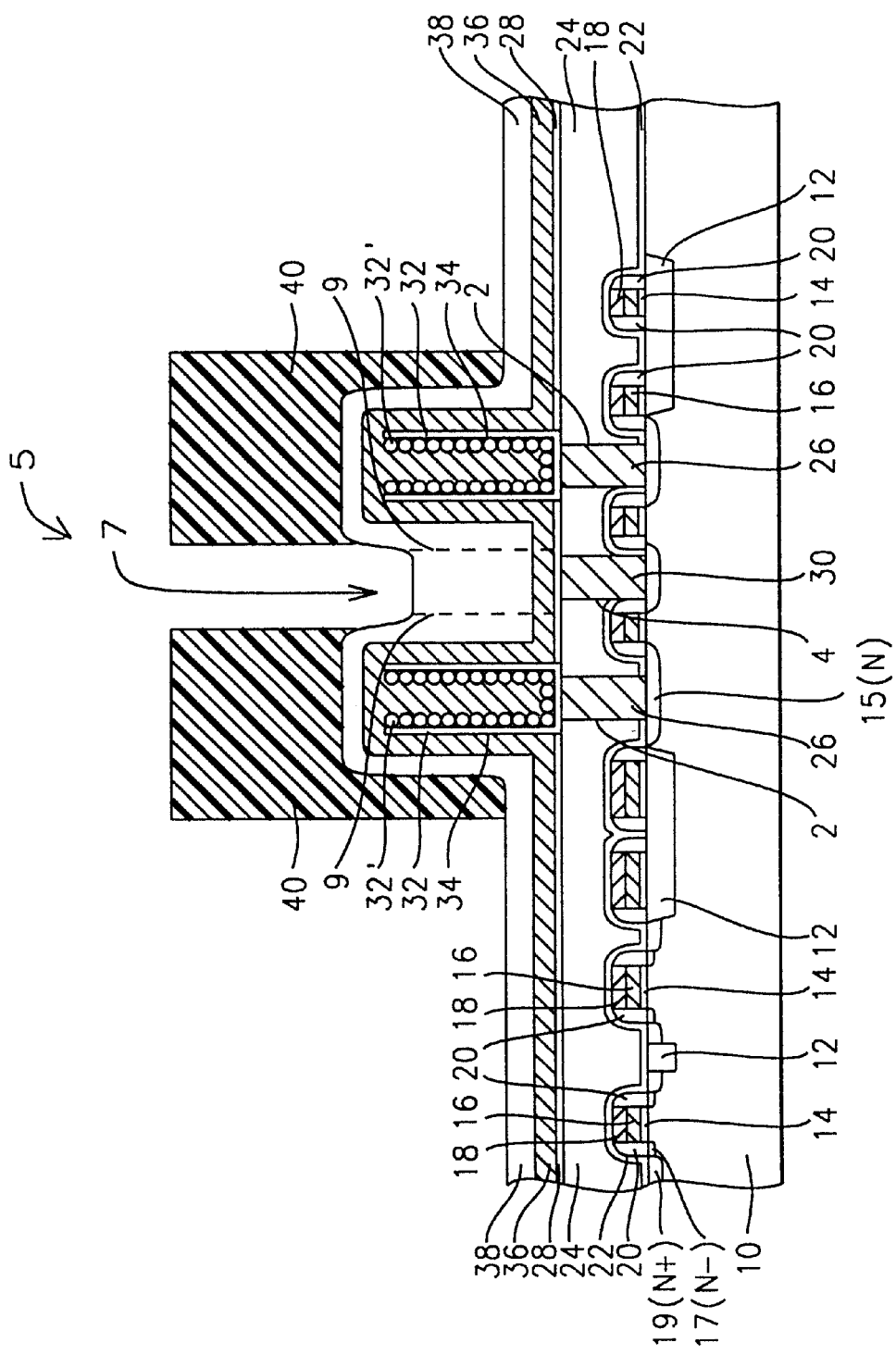

Referring to FIG. 6, another important feature of the invention is to deposit a bottom antireflecting coating (BARC) 38 sufficiently thick to fill the spaces S between the capacitors to minimize the rough topography between capacitors, to overcome the rough topography problem cited in the prior art of FIG. 13. A photoresist layer 40 is deposited. The thicker BARC layer 38 in the spaces S results in a thinner and more uniform photoresist layer (etch mask) 40 over the spaces S. This allows the photoresist layer 40 to be exposed and developed with improved fidelity (better resolution and less distortion) for patterning the polysilicon layer 36 over the high aspect ratio spaces S between the capacitors. This method is essential for reliably patterning the polysilicon layer 36 between capacitors and forming reliable bit line contacts to the polysilicon plugs 30 in the openings 4 for the bit lines. The BARC layer 38 is preferably an organic polymer deposited by spin coating. One preferred BARC material is a primary primary polyimide dissolved in a solvent such as Cyclohexanone or PGMEA. A photoressist layer is then deposited by spin coating and conventional photolithographic techniques are used to expose and develop a photoresist etch mask 40, as shown in FIG. 6.

Still referring to FIG. 6, the exposed bottom antireflective coating (BARC) 38 is then anisotopically plasma etched to form well defined openings 7, as depicted by the vertical dashed lines 9 in FIG. 6. The openings 7 are aligned over the polysilicon landing plugs 30 in the bit line contact openings 4. The plasma etching of the BARC is preferably carried out by reactive ion etching (RIE) using an etchant gas, such as oxygen ($O_2$).

Figure 7:
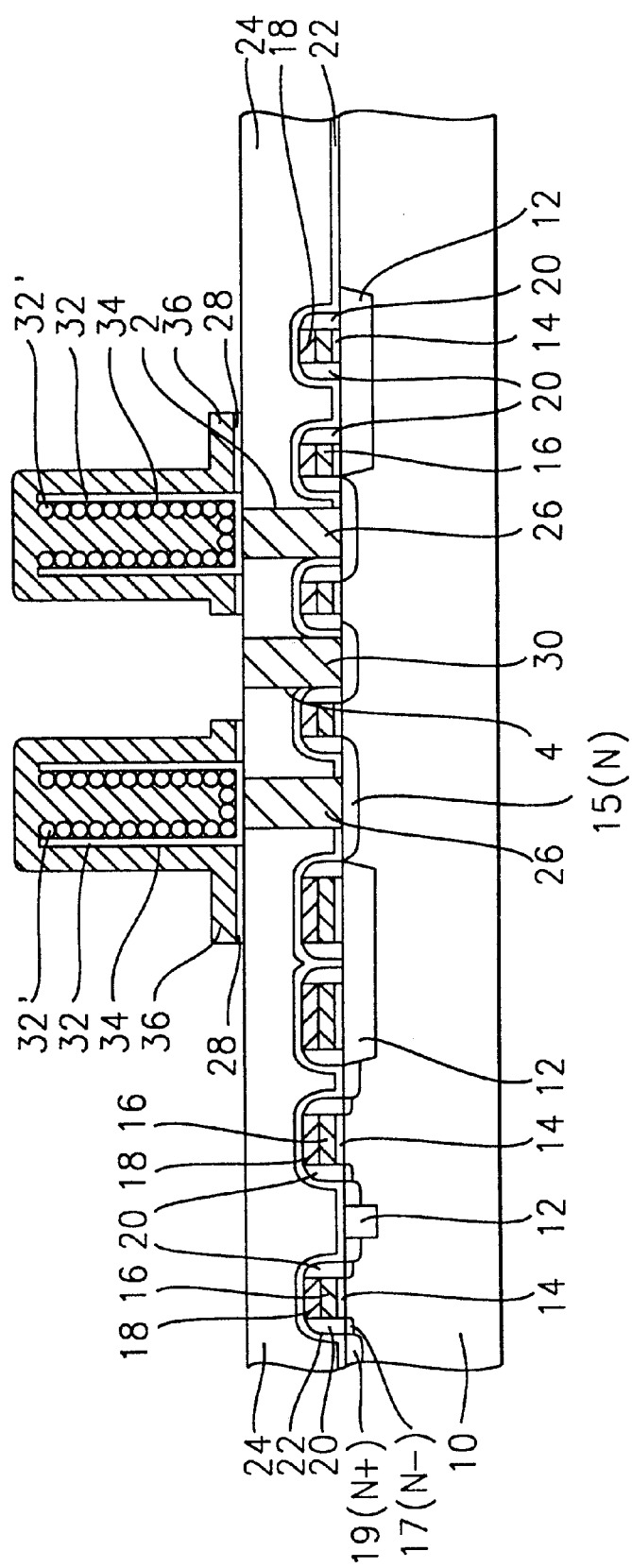

As shown in FIG. 7, the photoresist/BARC etch mask (38,40) is then used to pattern the fourth polysilicon layer 36 to form the capacitor top electrodes (plates). Layers 36 and 28 are selectively etched down to the surface of layer 24 using RIE and an etchant gas mixture such as $Cl_2$/HBr/$HeO_2$. The photoresist/BARC mask is then removed by plasma ashing in oxygen or by ashing and using a wet photoresist stripper.

Figure 8:
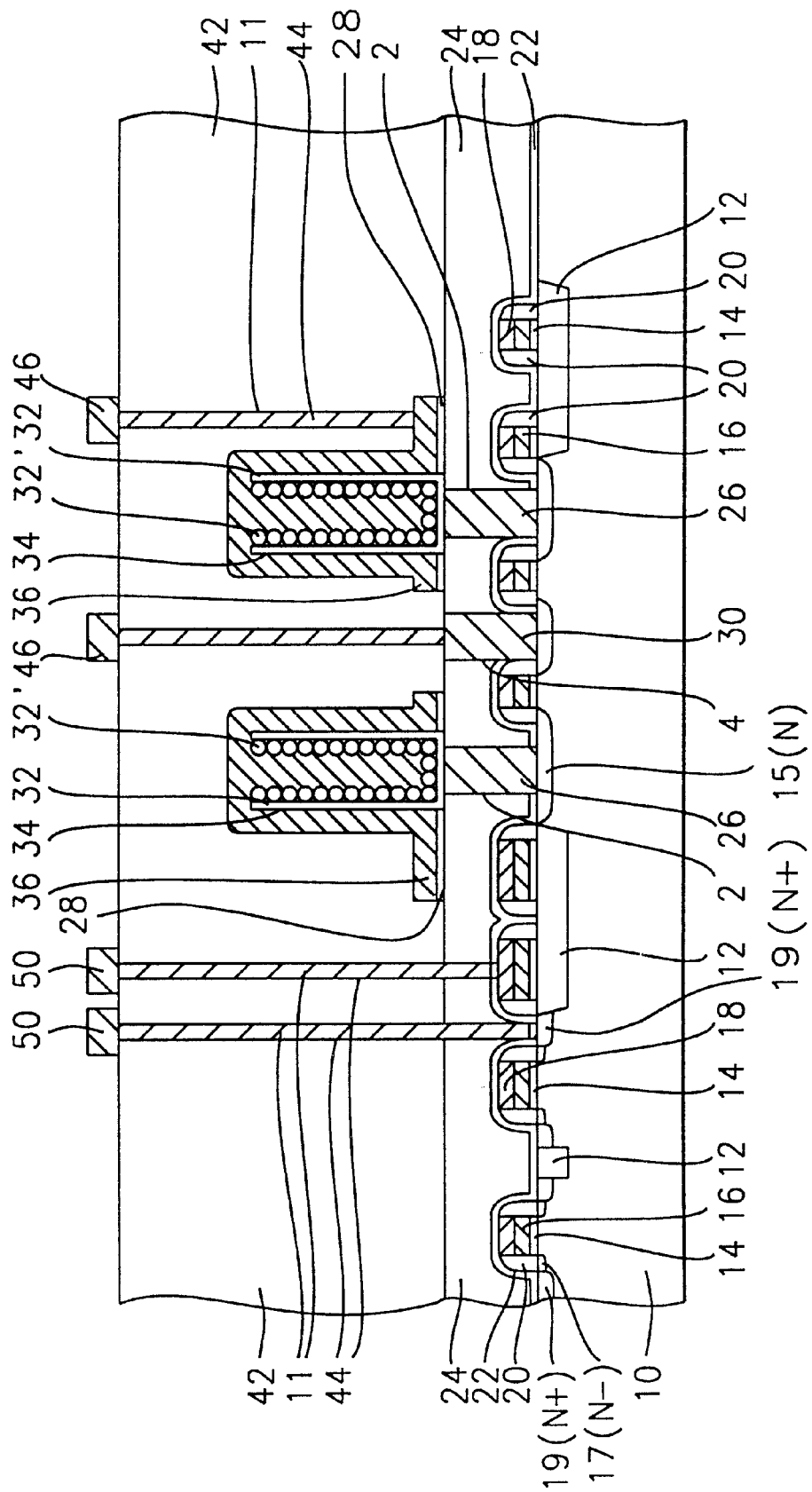

Referring to FIG 8, the embedded DRAM and logic circuits are now completed to the first level of metal interconnections. A relatively thick fourth insulating layer 42, commonly referred to as an interlevel dielectric (ILD) layer is deposited over the capacitors and planarized to provide electrical insulation and support for the next level of interconnections. Insulating layer 42 is preferably $SiO_2$ and is deposited by LPCVD using a reactant gas such as TEOS. Layer 42 is planarized by chemical-mechanical polishing to have a preferred thickness of between about 2000 and 4000 Angstroms over the capacitors. Via holes 11 are etched in the fourth insulating layer 42 to the polysilicon plugs 30 in the bit line contact openings 4, to the capacitor top electrodes 36, and concurrently etched to the source/drain contact areas 19($N^+$) and to the silicide layer 18 on the PIT gate electrodes in the logic regions. Metal plugs 44 are formed in the via holes 11 by depositing a tungsten (A) metal and etching or polishing back to the surface of the fourth insulator 42. For example, the tungsten can be deposited by CVD using $WF_6$ as the reactant gas. A metal layer, such as an aluminum-copper (Al/Cu) alloy or copper metal is formed to a thickness of between about 4000 and 6000 Angstroms and patterned to for bit lines 46 for the embedded DRAM circuits and first level of metal interconnections 50 for other circuit wiring, such as the wiring for the logic circuits.

Referring now to FIGS. 9 through 12, a second embodiment is described for making CUB DRAMs with improved bit line contact structures. The process is identical to the first embodiment up to and including the deposition of the fourth polysilicon layer 36 for the capacitor top electrodes (cell plates), as shown in FIG. 5. In the second embodiment only the DRAM region is depicted in the FIGS. 9 through 12 to simplify the drawings. These CUB DRAMs can also be merged with logic circuits similar to the first embodiment to reduce the metal contact aspect ratio that would otherwise be greater with a COB DRAM structure.

Figure 9:
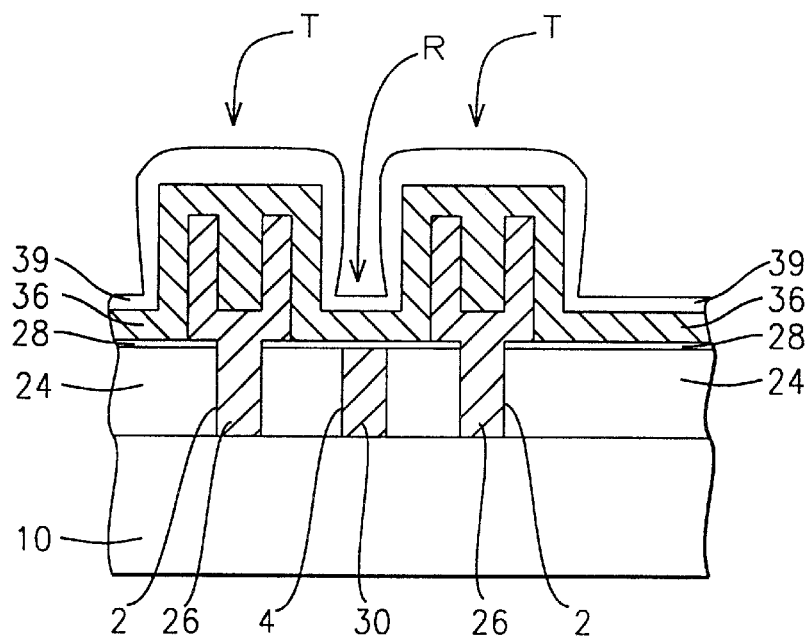
FIGS. 9 through 12 are schematic cross-sectional views, by a second embodiment, showing the sequence of process steps for making embedded CUB DRAM circuits with logic circuits using a non-conformal PECUD oxide layer to make capacitor top electrodes with improved profiles and bit line contact openings.

Referring to FIG. 9, the antireflective coating (BARC) 38 of the first embodiment is not used. Instead a non-conformal plasma enhanced CVD (PECVD) silicon oxide ($SiO_2$) layer 39 is deposited which is thicker on the top surface of the capacitors than in the high aspect ratio spaces between the capacitors. The PECVD oxide is deposited on the fourth polysilicon layer 36 to a thickness of between about 800 and 1500 Angstroms on the top surface T of the capacitors and to a corresponding thickness of between about 100 and 200 Angstroms on layer 36 in the deep recesses R between capacitors. More specifically, the PECVD oxide on the top surface of the capacitor is deposited to a thickness of about 1000 Angstroms and the corresponding thickness on the bottom surface between capacitors is about 200 Angstroms. For example, the PECVD oxide can be deposited in a PECVD reactor such as model PR5000 manufactured by Applied Materials of U.S.A. The deposition is carried out using a reactant gas mixture of $SiH_4/O_3$. The PECVD oxide layer 39 is deposited using processing parameters that result in a CVD oxide that is thicker over the capacitors than it is between the capacitors.

Figure 10:
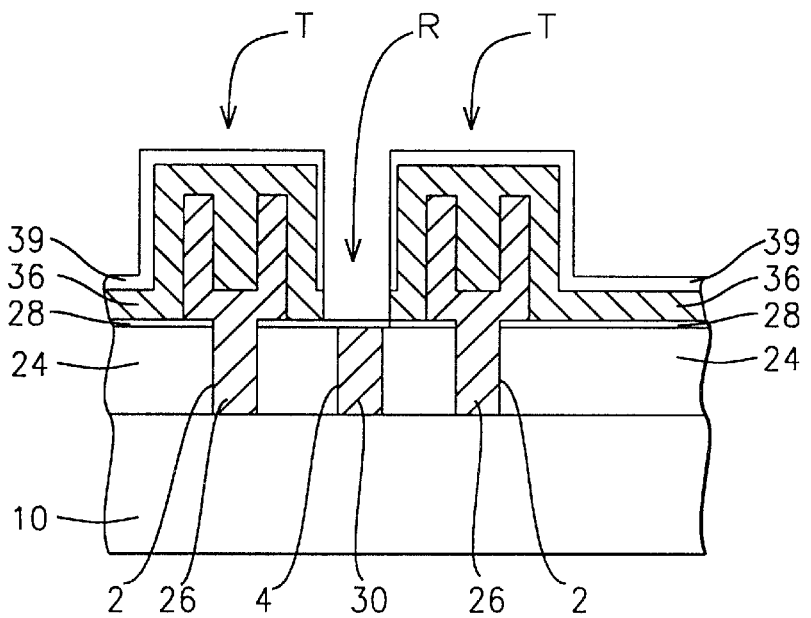

Referring next to FIG. 10, a blanket anisotropic plasma etch-back is carried out to etch open the thin PECVD oxide layer 39 (about 200 Angstroms) at the bottom of the recess (labeled R in FIG. 9) while the thicker oxide layer on the top of the capacitors protects the capacitors from being etched. The plasma etching is preferably carried out using reactive ion etching or a high-density plasma (HDP) etcher, and an etchant gas such as $CF_4/CHF_3$. The thicker PECVD oxide 39 remaining on the top and sides of the capacitors results in a hard mask with self-aligned openings between capacitors and over the polysilicon plugs 30 in the bit line contacts openings 4. The PECVD oxide hard mask is then used to anisotropically plasma etch the underlying fourth polysilicon layer 36 to the second etch-stop layer 28. The polysilicon plasma etch is preferably carried out in a reactive ion etcher or HDP etcher using an etchant gas such as $Cl_2/HBr$.

Figure 11:
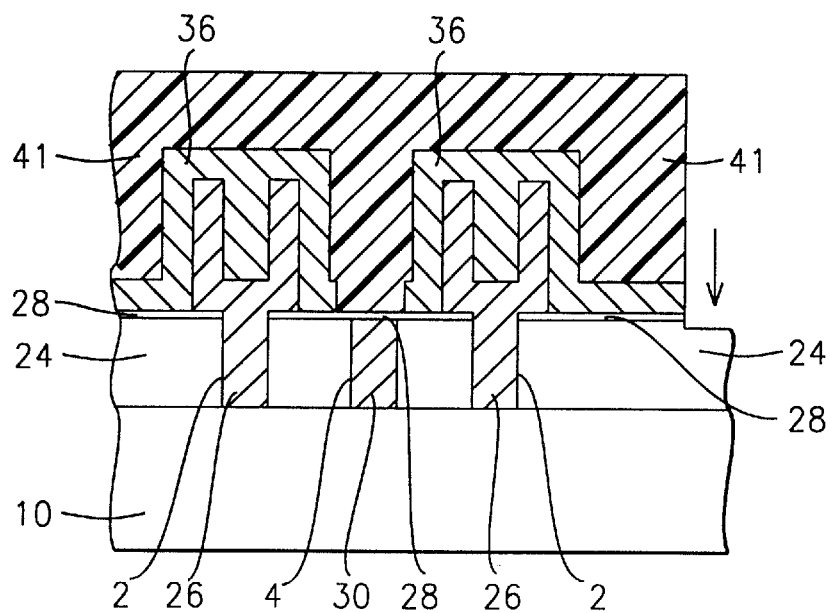

Now as shown in FIG. 11, a photoresist mask 41 and plasma etching are used to pattern the fourth polysilicon layer 36 to complete the capacitor top electrodes 36. Since the polysilicon layer 36 was patterned (opened) over the bit line contact opening 4 in the prior step, the need to expose and develop a high aspect ratio image in the photoresist layer 41 between the capacitors is avoided. This eliminates the problem cited above with respect to the prior art of FIG. 13.

Figure 12:
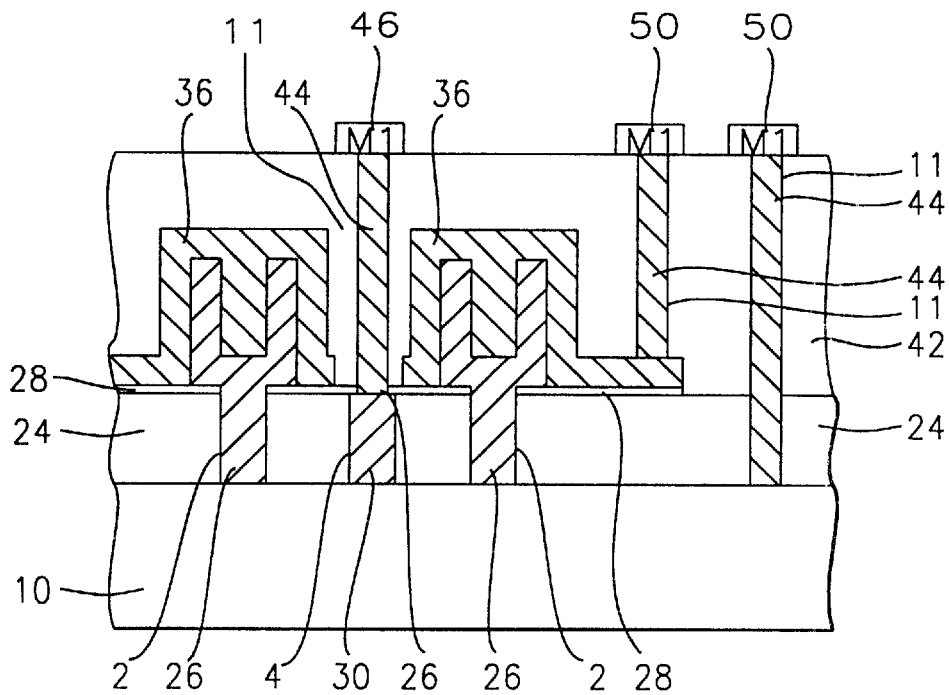

Referring to FIG. 12, the remaining process steps in the second embodiment for completing the embedded DRAM to the first level of metal interconnections (including bit lines) is identical to the first embodiment. Briefly, after stripping the photoresist mask 41 a relatively thick fourth insulating layer 42 is deposited over the capacitors and planarized to provide electrical insulation and support for the next level of interconnections. Via holes 11 are etched in the fourth insulating layer 42 and second etch-stop layer 28 to the polysilicon plugs 30 in the bit line contact openings 4, to the capacitor top electrodes 36, and concurrently etched to the source/drain contact areas and to the FET gate electrodes in the logic regions, and DRAM peripheral circuits. Metal plugs 44 are formed in the via holes 11 by depositing a tungsten (W) metal and etching or polishing back to the surface of the fourth insulating layer 42. A metal layer, such as an aluminum-copper (Al/Cu) alloy or copper metal is deposited and patterned to form bit lines 46 for the embedded DRAM circuits and first level of metal interconnections 50 for other circuit wiring, such as the wiring for the logic circuits.

While the invention has been particularly shown and described with reference to the preferred embodiment thereof, it will be understood by those skilled in the art that various changes in form and details may be made without departing from the spirit and scope of the invention.

What is claimed is:

1. A method for fabricating embedded dynamic random access memory (DRAMA) circuits with logic integrated semiconductor circuits comprising the steps of:

providing a semicondutor substrate having a logic region and a memory region having device areas, said device areas surrounded and electrically isolated from each other by field oxide areas;

forming FETs having gate electrodes formed from a first polysilicon layer on said device areas, and having source/drain areas adjacent to said gate electrodes;

depositing a first etch-stop layer, and forming a planar first insulating layer thereon;

etching contact openings in said first insulating layer and sad first etch-stop layer to said source/drain areas in said memory regions for capacitor node contacts and bit line contacts and depositing a second polysilicon layer and polishing back to form poly-silicon plugs in said contact openings;

depositing a second etch-stop layer, and forming a planar second insulating layer, and forming capacitors for said embedded DRAM circuits by:

etching capacitor openings in said second insulating and said second etch-stop layers over and to said polysilicon plugs in said contact openings for said capacitor node contacts, and depositing and polishing back a conformal third polysilicon layer to said second insulating layer to form capacitor bottom electrodes in said capacitor openings;

removing said second insulating layer selectively and forming an interdielectric layer on said capacitor bottom electrodes;

depositing a blanket conformal fourth polysilicon layer sufficiently thick to fill said capacitor openings and to form capacitor top electrodes for said capacitors;

depositing a bottom antireflecting coating (BARC) sufficiently thick to fill spaces between said capacitors;

forming a patterned photoresist layer on said BARC to pattern said capacitor top electrodes, whereby said BARC reduces the topography of said photoresist layer resulting in improved photoresist resolution over said spaces between said capacitors;

plasma etching said BARC and etching said fourth polysilicon layer and said second etch-stop layer to for said capacitor top electrodes, and concurrently exposing said polysilicon plugs in said bit line contacts;

forming a planar third insulating layer over said capacitors;

etching via holes in said third insulating layer to said polysilicon plugs in said bit line contact openings, to said capacitor top electrodes and concurrently etching via holes to said source/drain areas and said gate electrodes in said logic regions;

forming metal plugs in said via holes;

depositing and patterning a metal layer to form bit lines for said embedded DRAM circuits and first level of metal interconnections for said logic region.

2. The method of claim 1, wherein said first poly-silicon layer is a conductively doped polysilicon and includes an upper tungsten silicide layer.

3. The method of claim 1, wherein said source/drain areas in said memory region are conductively doped to a concentration of between about 1.0 E 18 and 1.0 E 19 atoms/cm³, and said source/drain areas in said logic region are conductively doped to a concentration of between about 1.0 E 19 and 1.0 E 21 atom/cm$^3$.

4. The method of claim 1, wherein said first and second etch-stop layers are silicon nitride and are deposited to a thickness of between about 200 and 400 Angstroms.

5. The method of claim 1, wherein said second polysilicon layer is conductively doped to a concentration of between about 1.0 E 19 and 1.0 E 21 atoms/cm$^3$.

6. The method of claim 1, wherein said planar first, second and third insulating layers are a chemical vapor deposited silicon oxide and are made planar by chemical-mechanical polishing.

7. The method of claim 1, wherein said conformal third polysilicon layer is formed by depositing an amorphous silicon layer and annealing to form a hemispherical silicon grain (HSG) surface to increase capacitance.

8. The method of claim 1, wherein said bottom antireflecting coating (BARC) is a polyimide and is dissolved in cyclohexanone.

9. The method of claim 1, wherein said metal plugs are formed by depositing a tungsten (W) layer by chemical vapor deposition (CVD) and using a reactant gas of tungsten hexafluoride (WF$_6$) and chemical-mechanical polishing back to said third insulating layer.

10. The method of claim 1, wherein said bit lines and said first level of metal interconnections are formed by depositing and patterning an aluminum/copper alloy.

11. A method for fabricating embedded dynamic random access memory (DRAM) circuits with logic integrated semiconductor circuits comprising the steps of:

providing a semiconductor substrate having a logic region and a memory region having device areas, said device areas surrounded and electrically isolated from each other by field oxide areas;

forming FETs having gate electrodes formed from a first polysilicon layer on said device areas, and having source/drain areas adjacent to said gate electrodes;

depositing a first etch-stop layer, and forming a planar first insulating layer thereon;

etching contact openings in said first insulating layer and said first etch-stop layer to said source/drain areas in said memory regions for capacitor node contacts and bit line contacts and depositing a second polysilicon Layer and polishing back to form polysilicon plugs in said contact openings;

depositing a second etch-stop layer, and forming a planar second insulating layer, and forming capacitors for said embedded DRAM circuits by:

etching capacitor openings in said second insulating and said second etch-stop layers over and to said polysilicon plugs in said contact openings for said capacitor node contacts, and depositing and polishing back a conformal third polysilicon layer to said second insulating layer to torn capacitor bottom electrodes in said capacitor openings;

removing said second insulating layer selectively and forming an interdielectric layer on said captor bottom electrodes;

depositing a blanket conformal fourth polysilicon layer sufficiently thick to fill said capacitor openings and to form capacitor top electrodes for said capacitors;

depositing a PECVD silicon oxide (SiO$_2$) layer which is thicker on a top surface of said capacitors than in the spaces between said capacitors over the bit line contact openings, and performing a blanket anisotropic plasma etch-back to form opening in said PECVD silicon oxide self-aligned to said capacitors and over sad bit line contact openings, and using said PECVD silicon oxide layer as an etch=ask to selectively etch openings in said fourth polysilicon layer and said second etch-stop layer to said polysilicon plugs in said bit line contact openings, patterning said fourth polysilicon layer to form said capacitor top electrodes using a photoresist mask and plasma etching;

forming a planar fourth insulating layer over said capacitors;

etching via holes in said fourth insulating layer to maid polysilicon plugs in said hit line contact openings, to said capacitor top electrodes and concurrently etching via holes to said source/drain areas and said gate electrodes in said logic regions;

forming metal plugs in said via holes;

depositing and patterning a metal layer to for bit lines for said ad DRAM circuits and first level of metal interconnections for said logic region.

12. The method of claim 11, wherein said first poly-silicon layer is a conductively doped polysilicon and includes an upper tungsten silicide layer.

13. The method of claim 11, wherein said source/drain areas in said memory region are conductively doped to a concentration of between at 1.0 E 18 and 1.0 E 19 atoms/cm$^3$, and said source/drain area in said logic region are conductive doped to a concentration of between about 1.0 E 19 and 1.0 E 21 atoms/cm$^3$.

14. The method of claim 11, wherein said first and second etch-stop layers are silicon nitride and are deposited to a thickness of between about 200 and 400 Angstroms.

15. The method of claim 11, wherein said second polysilicon layer is conductively doped to a concentration of between about 1.0 E 19 and 1.0 E 21 atoms/cm$^3$.

16. The method of claim 11, wherein said planar first, second and third insulating layers are a chemical vapor deposited silicon oxide and are made planar by chemical-mechanical polishing.

17. The method of claim 11, wherein said conformal third polysilicon layer is formed by depositing an amorphous silicon layer and annealing to form a hemispherical silicon grain (HSG) surface to increase capacitance.

18. The method of claim 11, wherein said CVD silicon oxide (SiO$_2$) is deposited by plasma enhanced chemical vapor deposition u sing processing parameters that achieve a thickness of between about 800 and 1500 Angstroms on the top surface of said capacitor, and at a thickness of between about 100 and 200 Angstroms at bottom in said spaces between said capacitors.

19. The method of claim 11, wherein said metal plugs are formed by depositing a tungsten (W) layer by chemical vapor deposition using CVD and a reactant gas of tungsten hexafluoride (WF$_6$) and chemical-mechanical polishing back to said third insulating layer.

20. The method of claim 11, wherein said bit lines and said first level of metal interconnections are formed by depositing and patterning an aluminum/copper alloy.

* * * * *